(12) United States Patent
He et al.

(10) Patent No.: US 10,379,883 B2
(45) Date of Patent: *Aug. 13, 2019

(54) SIMULATION OF HIGH PERFORMANCE COMPUTING (HPC) APPLICATION ENVIRONMENT USING VIRTUAL NODES

(71) Applicant: International Business Machines Corporation, Armonk, NY (US)

(72) Inventors: Jun He, Beijing (CN); Tsai-Yang Jea, Poughkeepsie, NY (US); William P. LePera, Poughkeepsie, NY (US); Hanhong Xue, Wappingers, NY (US)

(73) Assignee: International Business Machines Corporation, Armonk, NY (US)

( * ) Notice: Subject to any disclaimer, the term of this patent is extended or adjusted under 35 U.S.C. 154(b) by 583 days.

This patent is subject to a terminal disclaimer.

(21) Appl. No.: 14/458,856

(22) Filed: Aug. 13, 2014

(65) Prior Publication Data

US 2015/0205625 A1 Jul. 23, 2015

Related U.S. Application Data

(63) Continuation of application No. 14/157,774, filed on Jan. 17, 2014.

(51) Int. Cl.
*G06F 17/50* (2006.01)
*G06F 9/455* (2018.01)

(52) U.S. Cl.
CPC .......... *G06F 9/455* (2013.01); *G06F 9/45558* (2013.01); *G06F 17/5009* (2013.01)

(58) Field of Classification Search
None
See application file for complete search history.

(56) References Cited

U.S. PATENT DOCUMENTS

| | | | |
|---|---|---|---|
| 7,548,898 B1* | 6/2009 | Tarenskeen | G06F 17/303 |
| 7,577,959 B2 | 8/2009 | Nguyen et al. | |
| 7,774,191 B2 | 8/2010 | Berkowitz et al. | |
| 8,214,194 B2 | 7/2012 | Bank et al. | |
| 2004/0078493 A1 | 4/2004 | Blumrich | |
| 2005/0171752 A1 | 8/2005 | Patrizio et al. | |
| 2006/0048098 A1 | 3/2006 | Gatlin | |
| 2012/0167084 A1 | 6/2012 | Suit | |
| 2014/0047272 A1 | 2/2014 | Breternitz | |

FOREIGN PATENT DOCUMENTS

WO WO2012136326 A1 10/2012

OTHER PUBLICATIONS

WhatIs.com, What is instance, Sep. 2008, WhatIs.com, p. 1.*

(Continued)

*Primary Examiner* — Omar F Fernandez Rivas
*Assistant Examiner* — Bernard E Cothran
(74) *Attorney, Agent, or Firm* — Middleton Reutlinger

(57) ABSTRACT

A method, apparatus and program product simulate a high performance computing (HPC) application environment by creating a cluster of virtual nodes in one or more operating system instances executing on one or more physical computing node, thereby enabling a plurality of parallel tasks from an HPC application to be executed on the cluster of virtual nodes.

18 Claims, 6 Drawing Sheets

(56) References Cited

OTHER PUBLICATIONS

Emilio P. Mancini et al., "PerfCloud: GRID Services for Performance-oriented Development of Cloud Computing Applications," 2009 18th IEEE International Workshops on Enabling Technologies: Infrastructures for Collaborative Enterprises, 2009 IEEE, 201-206.
Cong Xu et al., "PVC: A Novel Personal Virtual Cluster based on Multi-core Platform," 24th International Symposium on Computer and Information Sciences (ISCIS), Sep. 14-16, 2009, Guzelyurt, Cyprus, 2009 IEEE, pp. 363-368.
Swen Böhm et al., "xSim: The Extreme-Scale Simulator," 2011 International Conf. on High Performance Computing and Simulation (HPCS), IEEE, pp. 280-286, 2011.
IBM, Parallel Environment for AIX and Linux, 2008, IBM, pp. 1-282.
TechTarget, Scalability, 2016, TechTarget, pp. 1-6.
Jungels, Virtualization in High-Performance Computing: An Analysis of Physical and Virtual Node Performance, 2012, Purdue University, pp. 1-263.
U.S. Patent and Trademark Office, Office Action issued in related U.S. Appl. No. 14/157,774 dated Nov. 15, 2016.
U.S. Patent and Trademark Office, Final Office Action issued in related U.S. Appl. No. 14/157,774 dated May 19, 2017.
U.S. Patent and Trademark Office, Office Action issued in related U.S. Appl. No. 14/157,774 dated Jan. 8, 2018.

* cited by examiner

SIMULATION OF HIGH PERFORMANCE COMPUTING (HPC) APPLICATION ENVIRONMENT USING VIRTUAL NODES

CROSS-REFERENCE TO RELATED APPLICATIONS

This application is a continuation of U.S. patent application Ser. No. 14/157,774, filed on Jan. 17, 2014 by Jun He, et al. entitled "SIMULATION OF HIGH PERFORMANCE COMPUTING (HPC) APPLICATION ENVIRONMENT USING VIRTUAL NODES," the entire disclosure of which is incorporated by reference herein.

FIELD OF THE INVENTION

The invention is generally related to computers and computer software, and in particular, to high performance computing (HPC) application environments.

BACKGROUND OF THE INVENTION

Computing technology has advanced at a remarkable pace, with each subsequent generation of computing system increasing in performance, functionality, and storage capacity, often at reduced cost. However, despite these advances, many scientific and business applications still demand massive computing power, which can only be met by extremely high performance computing (HPC) systems. One particular type of computing system architecture that is often used in high performance applications is a parallel processing computing system.

Generally, a parallel processing computing system comprises a plurality of physical computing nodes and is configured with an HPC application environment, e.g., including a runtime environment that supports the execution of a parallel application across multiple physical computing nodes. Some parallel processing computing systems, which may also be referred to as massively parallel processing computing systems, may have hundreds or thousands of individual physical computing nodes, and provide supercomputer class performance. Each physical computing node is typically of relatively modest computing power and generally includes one or more processors and a set of dedicated memory devices, and is configured with an operating system instance (OSI), as well as components defining a software stack for the runtime environment. To execute a parallel application, a cluster is generally created consisting of physical computing nodes, and one or more parallel tasks are executed within an OSI in each physical computing node and using the runtime environment such that tasks may be executed in parallel across all physical computing nodes in the cluster.

Some production environments, as noted above, may number in the thousands of physical computing nodes. Parallel applications developed for such production environments, however, can be difficult to develop and test, as the performance of some features may be significantly dependent upon the size of the cluster, and as some issues may arise only at scale (i.e., when executed in a large-scale cluster). However, in many instances it is impractical, often for cost reasons, to maintain a representative cluster of this size just for development and/or testing purposes. When development and testing is performed in a smaller test environment, therefore, scale-dependent issues may not be thoroughly tested, leading to sub-optimal performance and/or errors when a parallel application is later installed in a production environment.

Therefore, a substantial need continues to exist in the art for a manner of developing and/or testing a parallel application intended for use in a large scale HPC application environment.

SUMMARY OF THE INVENTION

The invention addresses these and other problems associated with the prior art by providing a method, apparatus and program product that simulate a high performance computing (HPC) application environment by creating a cluster of virtual nodes in one or more operating system instances executing on one or more physical computing node, thereby enabling a plurality of parallel tasks from an HPC application to be executed on the cluster of virtual nodes. By doing so, the virtual nodes may include only a subset of the software stack utilized to implement a physical computing node in a large-scale HPC application environment such that the overhead associated with the virtual node is reduced, thereby enabling a physical computing node to host multiple virtual nodes that, from the perspective of a parallel application, operate in the same manner as individual physical computing nodes. Thus, a relatively small number of physical computing nodes may be used for the purposes of testing, debugging and/or analyzing the functionality of a parallel application at a scale that is commensurate with a likely production environment, enabling, for example, testing and debugging of issues that may only arise at scale.

Therefore, consistent with one aspect of the invention, a high performance computing (HPC) application environment is simulated by creating a cluster of virtual nodes, and executing an HPC application on the cluster of virtual nodes. A plurality of virtual nodes in the cluster of virtual nodes are resident in an operating system instance executing on a physical computing node, and the HPC application includes a plurality of parallel tasks distributed among at least a subset of the virtual nodes in the cluster.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
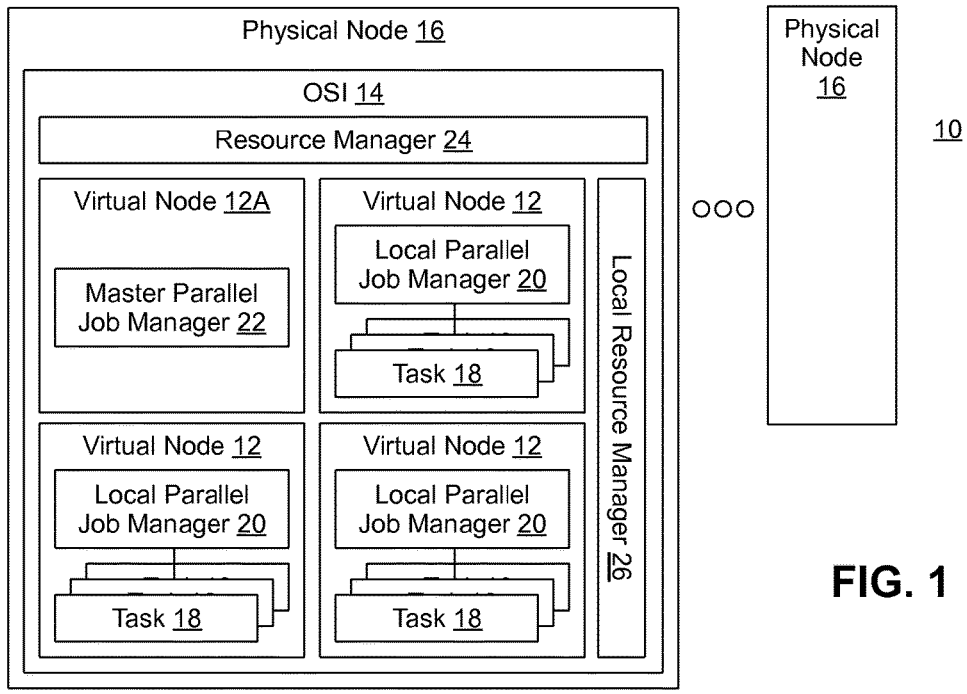
FIG. 1 is a block diagram of a simulated HPC application environment consistent with the invention.

Embodiments consistent with the invention simulate a high performance computing (HPC) application environment by creating a cluster of virtual nodes in one or more operating system instances executing on one or more physical computing nodes, thereby enabling a plurality of parallel tasks from an HPC application to be executed on the cluster of virtual nodes.

In this regard, an HPC application environment consistent with the invention may be considered to include a hardware and/or software environment suitable for hosting an HPC application, generally implemented using a plurality of parallel tasks. In many production environments, an HPC application may be implemented using hundreds, thousands, or more parallel tasks running on hundreds, thousands, or more physical computing nodes. By simulating such an environment, a comparatively smaller number of physical computing nodes, e.g., as few as one physical computing node, may host a plurality of virtual nodes that simulate comparatively large numbers of physical computing nodes to enable, for example, an HPC or parallel application to be run in conditions that emulate a production environment with large numbers of physical computing nodes.

For example, in a production environment, each physical computing node in an HPC application environment may include an operating system instance (OSI) representing the complete framework suitable for hosting one or more parallel tasks from an HPC application, along with suitable management code for allocating and managing resources and communicating data between parallel tasks both internally within and externally from a physical computing node. In embodiments consistent with the invention, the operating system instance within a physical computing node implements a lightweight framework that supports multiple virtual nodes, but with only a subset of the software stack utilized to host a parallel task resident within each virtual node, with additional portions of the software stack remaining outside of the virtual nodes and extended to support multiple virtual nodes within an operating system instance.

In one example embodiment, for example, a lightweight framework may implement an HPC runtime environment, and may utilize one or more parallel job management components, e.g., master and local parallel job managers within virtual nodes to manage parallel tasks, along with one or more resource manager components external to the virtual nodes but within an operating system instance. A parallel job manager, in this regard, is a component that participates directly or indirectly in the management of parallel tasks. Local parallel job managers are generally disposed within a virtual node to directly manage the parallel tasks within the virtual node, while a master parallel job manager generally works in a supervisory capacity with the local parallel job managers, and is generally the primary vehicle through which a user process communicates input data, output data and/or error data with a parallel application. A master parallel job manager may be disposed in a separate virtual node in some embodiments, and may or may not have parallel tasks to directly manage within the same virtual node. Parallel job managers may be implemented as daemons.

A resource manager is a component that, in the illustrated embodiments, resides external from a virtual node but within an operating system instance, and is used to manage processor, memory and/or network resources on behalf of one or more virtual nodes. A resource manager may be implemented as a daemon, and may be configured to collect machine updates from an executing machine, generate events to a scheduler for changes in machine status, maintain a list of jobs managed by the resource manager, and respond to query requests for machine, job, and cluster information. A local resource manager may maintain a network resource table (NRT) information to enable parallel tasks to communicate with other parallel tasks, regardless of whether those other parallel tasks are in the same virtual node, and regardless of whether those other parallel tasks are even in the same physical computing node. In the illustrated embodiments, the local resource manager may be extended to work as a network resource virtualization manager to enable other components in the runtime environment to launch higher numbers of parallel tasks.

In some embodiments, for example, a global resource manager may be used to maintain the resource requirements for a job, and may query a local resource manager on each virtual node to determine if there are sufficient resources to run the job. The global resource manager may then build a global network resource table and start a master parallel job manager, which will in turn start a local parallel job manager on each virtual node, and these local managers may spawn the parallel tasks.

For example, turning to the Drawings, wherein like parts denote like numbers throughout the several views, FIG. 1 illustrates an example simulated HPC application environment 10 consistent with the invention. In this environment, a plurality of virtual nodes 12, 12A are resident in one or more operating system instances 14 resident in one or more physical computing nodes 16, and are capable of hosting a plurality of parallel tasks 18.

The software stack for each operating system instance 14 includes, within each virtual node 12, a local parallel job manager 20 for managing the parallel tasks 18 resident in the virtual node 12. A master parallel job manager 22 is resident in a master virtual node 12A to provide global parallel job management and oversee the local parallel job managers 20. It will be appreciated that master parallel job manager 22 need not be run on every physical computing node or OSI, and generally only one master parallel job manager is utilized for a job in a cluster. A resource manager 24 and local resource manager 26, however, are implemented external from the virtual nodes 12, 12A and are extended to support multiple nodes. The local resource manager 26, for example, may function as a network resource virtualization manager to enable other framework components to launch higher numbers of parallel tasks for a job.

In this scenario, each virtual node may be considered to be a group of resources (e.g., network, CPU, and memory). As compared to a production environment, memory footprint may be reduced as only the parallel tasks 18 and local parallel job managers 20 use additional resources (generally apart from the increased utilization for a single instance of an enhanced local resource manager 26. The specific network resources may be allocated from the extended local resource manager 26, allowing the simulation of a complete, large scale parallel job in a comparatively small number of physical computing nodes.

Other variations and modifications will be apparent to one of ordinary skill in the art. Therefore, the invention is not limited to the specific implementations discussed herein.

Hardware and Software Environment

Figure 2:
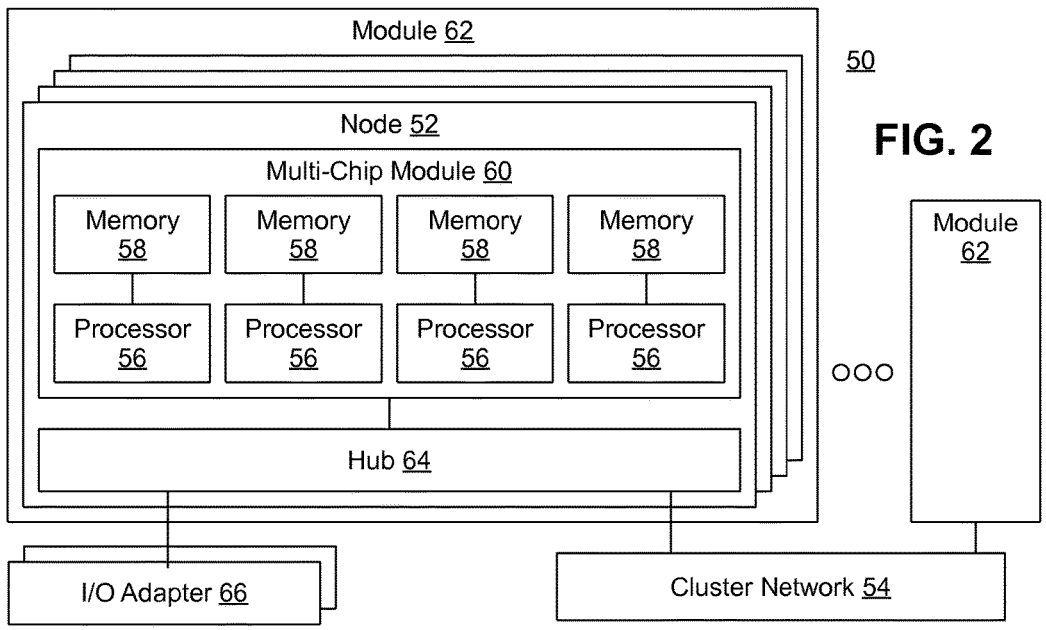
FIG. 2 is a block diagram of an example hardware environment capable of hosting the simulated HPC application environment of FIG. 2.

Turning now to FIG. 2, the principal hardware components in an apparatus 50 capable of implementing a simulated HPC application environment consistent with the invention are illustrated. Apparatus 50 is illustrated as an HPC system incorporating a plurality of physical computing nodes 52 coupled to one another over a cluster network 54, and including a plurality of processors 56 coupled to a plurality of memory devices 58 representing the computational and memory resources of the HPC system.

Apparatus 50 may be implemented using any of a number of different architectures suitable for executing HPC applications, e.g., a supercomputer architecture. For example, in one embodiment, apparatus 50 may be implemented as a Power7 IH-based system available from International Business Machines Corporation. In this implementation, processors 56 and memory devices 58 may be disposed on multi-chip modules 60, e.g., quad chip modules (QCM's), which in turn may be disposed within a physical computing node 52 along with a hub chip 64 that provides access to one or more input/output (I/O) adapters 66, which may be used to access network, storage and other external resources. Multiple (e.g., eight) physical computing nodes 52 (also referred to as octants) may be organized together into modules 62, e.g., rack modules or drawers, and physical computing nodes may be further organized into supernodes, cabinets, data centers, etc. It will be appreciated that other architectures suitable for executing HPC applications may be used, e.g., any of the Blue Gene/L, Blue Gene/P, and Blue Gene/Q architectures available from International Business Machines Corporation, among others. Therefore, the invention is not limited to use with the Power7 IH architecture disclosed herein.

Each processor 56 may be implemented as a single or multi-threaded processor and/or as a single or multi-core processor, while each memory 58 may be considered to include one or more levels of memory devices, e.g., a DRAM-based main storage, as well as one or more levels of data, instruction and/or combination caches, with certain caches either serving individual processors or multiple processors as is well known in the art. In addition, the memory of apparatus 50 may be considered to include memory storage physically located elsewhere in apparatus 50, e.g., any cache memory in a processor, as well as any storage capacity used as a virtual memory, e.g., as stored on a mass storage device or on another computer coupled to apparatus 50.

Apparatus 50 operates under the control of an operating system and executes or otherwise relies upon various computer software applications, components, programs, objects, modules, data structures, etc., as will be described in greater detail below. Moreover, various applications, components, programs, objects, modules, etc. may also execute on one or more processors in another computer coupled to apparatus 50 via network, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include tangible, recordable type media such as volatile and non-volatile memory devices (e.g., memory 14), floppy and other removable disks, hard disk drives, magnetic tape, and optical disks (e.g., CD-ROMs, DVDs, etc.), among others.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

Those skilled in the art will recognize that the example environment illustrated in FIG. 2 is not intended to limit the present invention. Indeed, those skilled in the art will recognize that other alternative hardware and/or software environments may be used without departing from the scope of the invention.

Simulation of HPC Application Environment Using Virtual Nodes

Embodiments consistent with the invention simulate a high performance computing (HPC) application environment using multiple virtual nodes resident in one or more operating system instances executing on one or more physical computing nodes. In the discussion hereinafter, an implementation of the invention utilizing the IBM Parallel Environment Runtime Edition (PE RTE) platform, available from International Business Machines Corporation, is described. The invention, however, is not limited to such an implementation, and as such, it will be appreciated that the invention may be used in connection with other hardware and/or software environments.

The IBM Parallel Environment Runtime Edition (PE RTE) platform is a highly functional and extensible High Performance Computing (HPC) software suite that enables solutions for high-end deployments, with typical production environments for such deployments often numbering in the thousands of physical computing nodes. Maintaining a representative cluster of physical computing nodes for development and testing purposes is often cost-prohibitive, yet in many HPC environments a need arises to measure performance of new features or to debug issues that only occur at scale.

Embodiments consistent with the invention address this need by providing a lightweight virtualization framework suitable for simulating a large-scale HPC application environment using a smaller number of physical computing nodes than would otherwise be required in a production environment. The lightweight virtualization framework supports the creation of a cluster of virtual nodes, with each virtual node containing only a subset of the PE RTE elements otherwise utilized in the physical nodes of a production environment to reduce the footprint of each virtual node.

Virtual nodes consistent with the invention, for example, may be used to provide Resource Managers (RM's) with additional nodes to validate resource management and scheduling, or to verify that the RM's can work for larger scale jobs, including multiple concurrent jobs (i.e., as opposed to a single, large job). Other benefits and features that may be realized as a result of simulating a large-scale HPC application environment using virtual nodes will be apparent to one of ordinary skill in the art having the benefit of the instant disclosure.

Figure 3:
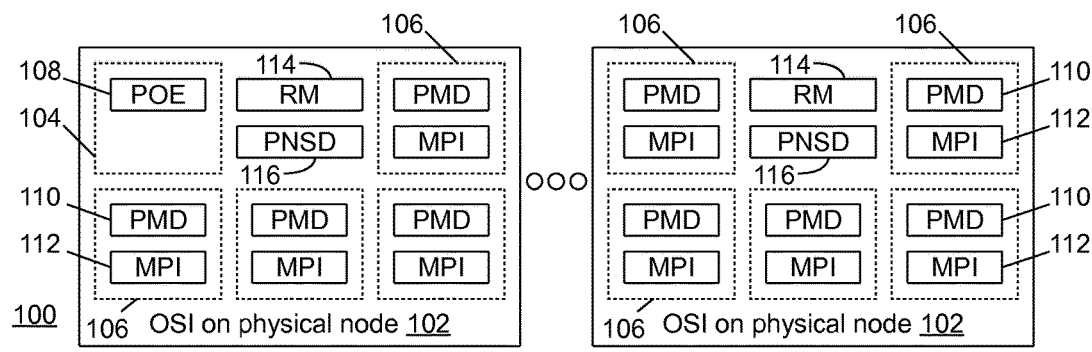
FIG. 3 is a block diagram of an example lightweight framework suitable for implementing a simulated HPC application environment consistent with the invention.

FIG. 3 illustrates an example simulated HPC application environment 100 utilizing a plurality of operating system instances (OSI's) 102 resident on a plurality of physical computing nodes, and utilizing a plurality of virtual nodes 104, 106 within each OSI 102 capable of simulating a large-scale HPC application environment in a manner consistent with the invention. Each virtual node 104, 106 is implemented using a lightweight framework, and including only a subset of the PE RTE elements that are otherwise utilized in each OSI used in a production environment. Thus, in contrast with a production environment in which each OSI generally includes one or more a complete copy of the PE RTE HPC software stack in each instance (i.e., Partition Management Daemons (PMD's), a plurality of parallel tasks (such as MPI ranks), one or more Resource Managers (RM's) and one or more Protocol Network Services Daemons (PNSD's), along with a Parallel Operating Environment (POE) application residing in one of the OSI's participating in a job in a cluster), each virtual node 104, 106 may include only a subset of the software stack suitable for managing the parallel tasks resident in the virtual node.

Thus, for example, a master virtual node 104 may include an instance of a POE application 108, while the other virtual nodes 106 may each include instances of a PMD 110 and one or more MPI ranks 112. Global and local resource managers, including RM 114 and PNSD 116, may be resident outside of the virtual nodes 104, 106, but still within each OSI 102 to support all of the virtual nodes 104, 106 resident in the OSI 102. In one embodiment, RM 114 may be a Load-Leveler or Platform LSF compatible workload manager.

In contrast, other potential approaches, such as hosting multiple OSI's within a physical node using logical partitioning (e.g., using Kernel Virtual Machines (KVM's)), would require a separate OSI with a complete copy of the PE RTE HPC software stack on each image. The KVM's would consume significant memory, disk, and CPU resources from a physical node, thereby limiting the scale that could be achieved.

In this embodiment, PNSD 116 may be extended to include network resource virtualization manager functionality to enable other PE RTE components to launch higher numbers of parallel tasks for a job. In this scenario, the virtualized node may be considered to be a group of resources (e.g., network, CPU, and memory). However, memory footprint is reduced as only the MPI parallel task and job manager are using additional resources (apart from the increased utilization for the single copy of the enhanced PNSD). The specific Ethernet, Infiniband (IB), or Host Fabric Interconnect (HFI) network resource is allocated from the extended PNSD, allowing the simulation of a complete, large scale parallel job.

Figure 4:
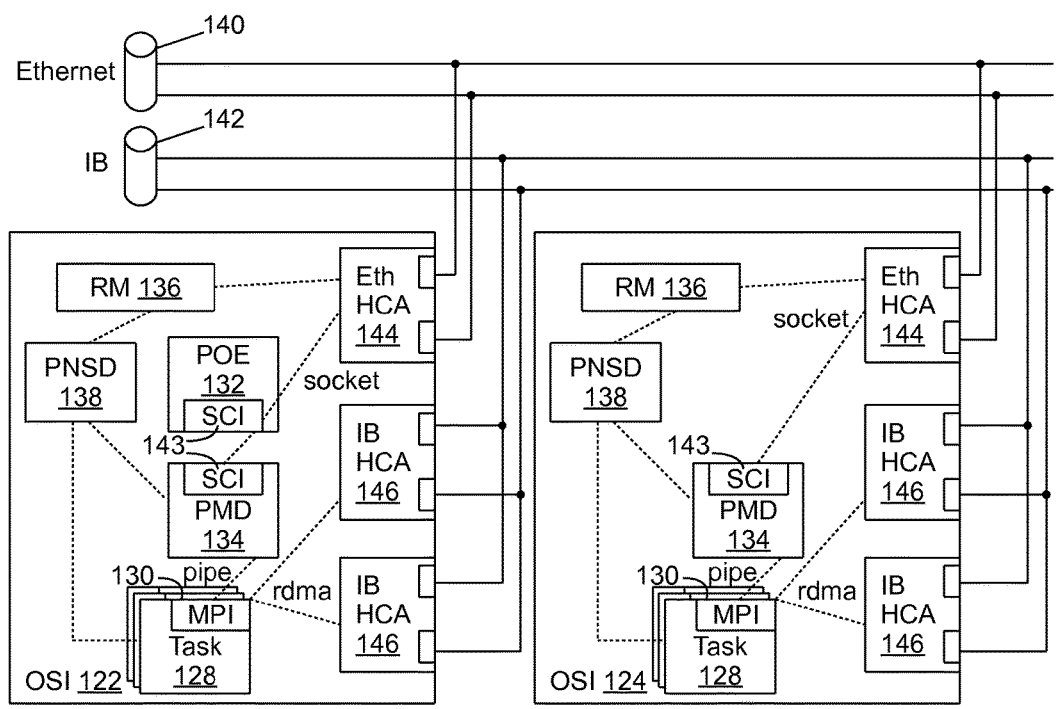
FIG. 4 is a block diagram of an example logical architecture of a large scale parallel job in a cluster.

As a further explanation of the resources generally required to run a large scale job using the PE RTE environment, FIG. 4 illustrates at 120 a logical architecture for a large scale parallel job in a cluster. In general, a large scale parallel application may be implemented using a number of different parallel programming models, e.g., the Message Passing Interface (MPI) programming model, an Asynchronous Partitioned Global Address Space (APGAS) model such as UPC or X10, or in other manners understood in the art. These applications are referred to hereinafter as parallel jobs.

A plurality of OSI's 122, 124, generally resident on separate physical computing nodes, host a plurality of parallel tasks 128 that implement a plurality of MPI ranks 130 for a large scale parallel job. A Parallel Operating Environment (POE) application 132 (in OSI 122) and Partition Management Daemons (PMD's) 134 (in both OSI's 122, 124) are used for the management of parallel tasks 128. They operate in conjunction with other management daemons, such as Resource Managers (RM's) 136 and PNSD 138, which allocate and manage resources for the job. To maximize performance, the management daemons use a separate management domain network 140 (typically over Ethernet), while the parallel tasks (MPI ranks) themselves communicate over a high-performance network, e.g., Infiniband 142 or HFI, e.g., over Scalable Coherent Interface (SCI) sockets 143 using one or more Ethernet Host Channel Adapters (HCA's) 144 (for the management domain network) and using Remote Direct Memory Access (RDMA) through one or more Infiniband HCA's 146.

Figure 5:
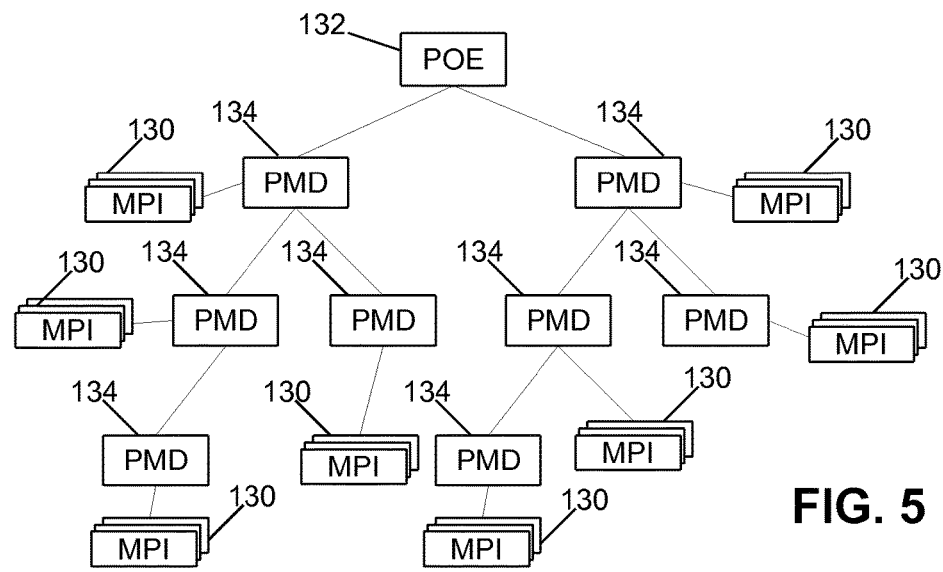
FIG. 5 is a tree diagram of an example large scale parallel job managed by POE/PMD daemons in a tree topology.

Within the PE RTE architecture, POE utilizes the Scalable Communication Interface (SCI) communication library to construct the POE management daemons into a logical tree topology that is used to launch and manage ultra-large scale parallel jobs, as illustrated in FIG. 5. Returning to FIG. 4, in a typical PE RTE implementation, PNSD 138 only supports one PMD daemon 134 per parallel job, per OSI 122-124. PMD 134 on each physical node generally constructs routing tables of local tasks using IB or HFI, querying PNSD 138 for routing information from the local physical node. These tables are collected and forwarded to POE 132, which builds a global routing table. POE 132 then sends this global table back to all of the child PMD's 134. Each PMD 134 then loads the global network table into the local PNSD 138. As a result of this scalable table routing mechanism, a point-to-point communications path may be established between any tasks in the job. This in turn allows the MPI library to implement collective communication domains.

For a further understanding of how the herein-described simulation technique operates, recall the aforementioned concepts from FIG. 3: concurrent PMD's 110 and their MPI ranks 112 run on a physical node. On each such physical node, PNSD 116 generally manages and allocates virtual nodes 106 for each concurrent PMD 110 and their associated MPI ranks 112.

Figure 6:
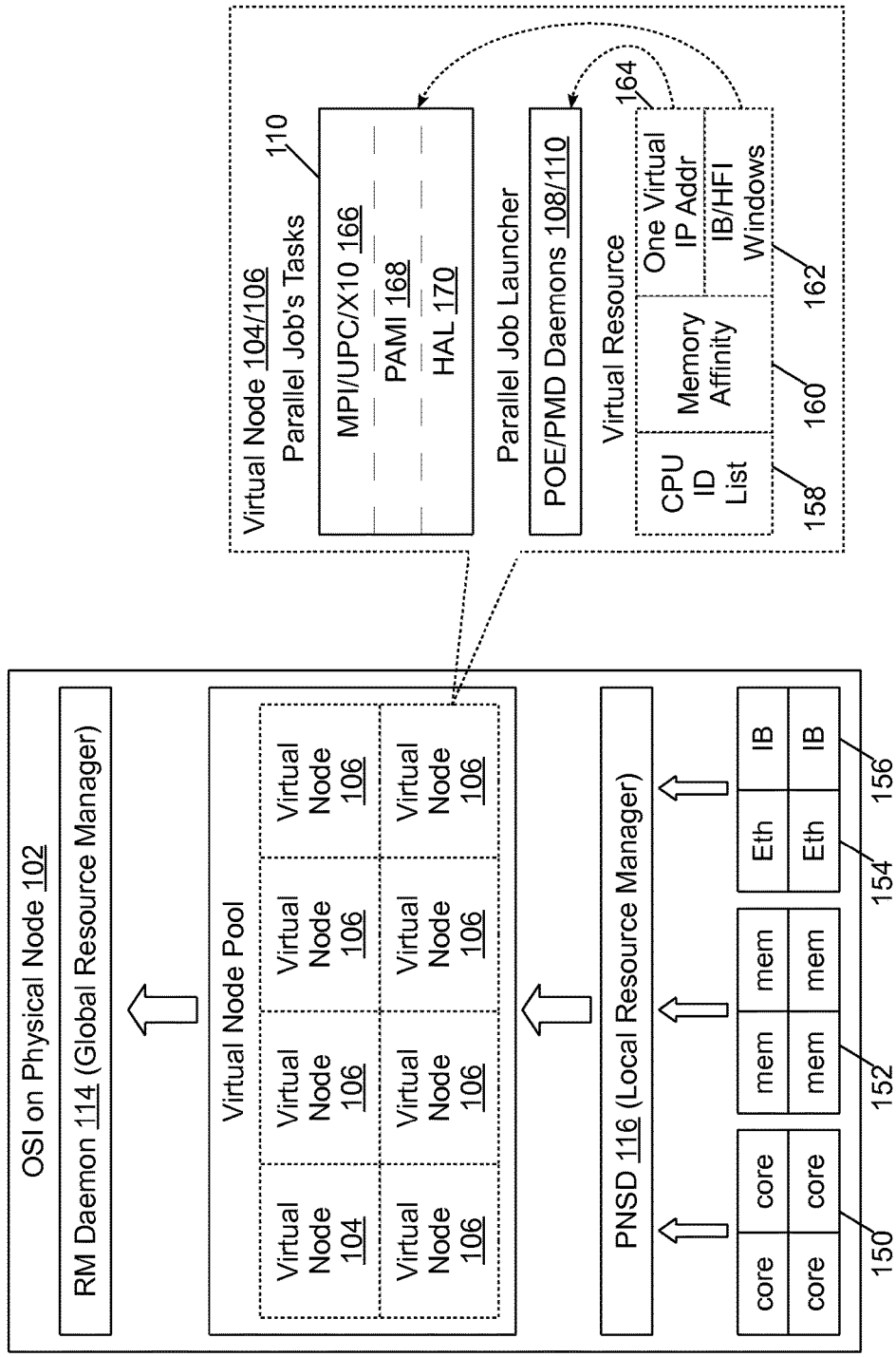
FIG. 6 is a block diagram illustrating example resource abstraction in the simulated HPC application environment of FIG. 3.

FIG. 6 illustrates how PNSD 116 may abstract resources e.g., processors 150, memory 152, and network (Ethernet 154 and/or Infiniband 156) resources on a physical node 102. PNSD 116 operates as a local resource manager while RM daemon 114 operates as a global resource manager, and within each virtual node 104, 106, POE/PMD daemons 108, 110 operate as parallel job launchers (it being understood that only one instance of POE 108 executes per job/cluster). Each node includes a mapping of resources, including a CPU ID list 158, memory affinity table 160, IB/HFI windows 162 for use by daemons 108, 110, and virtual IP addresses 164 used by MPI ranks 110. Each task 110 utilizes a parallel programming model 166, e.g., MPI, UPC or X10, parallel active message interface (PAMI) 168 and HAL 170.

Figure 7:
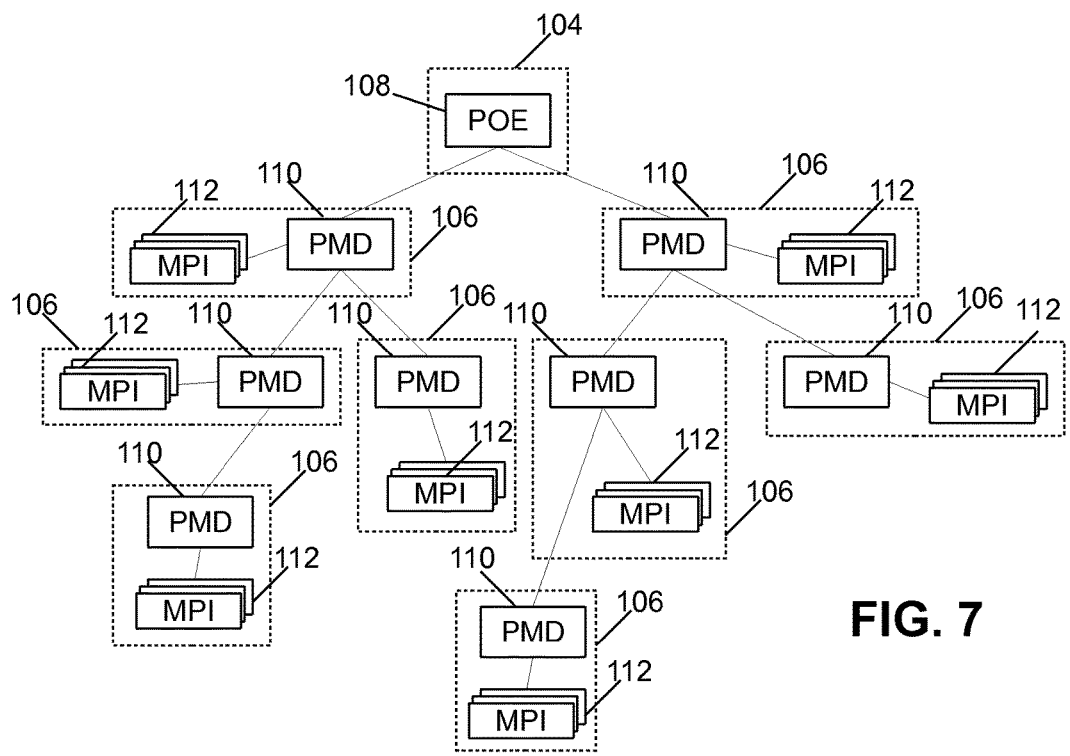
FIG. 7 is a tree diagram of the example large scale parallel job of FIG. 5 allocated to a plurality of virtual nodes in a manner consistent with the invention.

Each virtual node 104, 106 provides an abstraction that is flexible and loose-coupled to hardware. When there is a single virtual node on an OSI, the virtual node may be considered to be equivalent to a full OSI implementation, thereby allowing the herein-described implementation to be effectively transparent to the existing PE RTE architecture; it generally only impacts configurations set up to emulate scaling. By combining FIGS. 3 and 5 therefore POE job scalability may be smoothly merged into an existing tree hierarchy, as shown in FIG. 7, which is consistent with the existing PE RTE architecture, and where POE/PMD daemons 108, 110 and associated MPI ranks 112 are organized within virtual nodes 104, 106.

Figure 8:
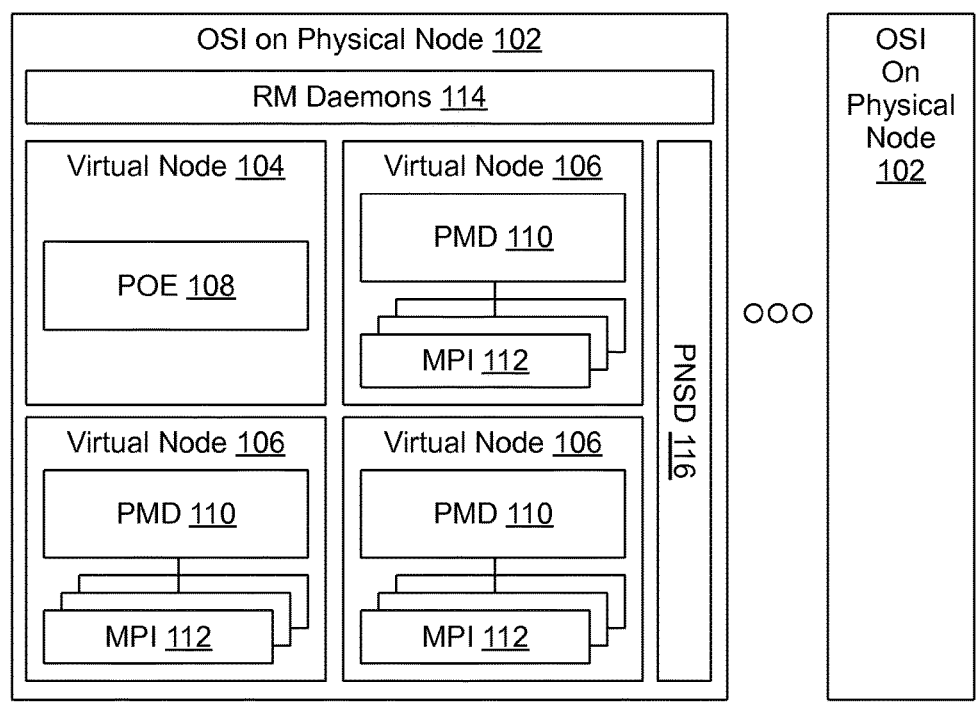
FIG. 8 is a block diagram of the simulated HPC application environment of FIG. 3.

Accordingly, in the illustrated embodiment, and as illustrated in FIG. 8, each POE/PMD daemon 108, 110 and associated MPI ranks 112 may use a virtual node 104, 106. The socket connection between POE 108 and the PMD's 110 may be built with the virtual IP address of each virtual node 104, 106. The PMD 110 and tasks 112 may communicate through pipes since the PMD 110 may be configured as the parent process of the MPI tasks 112. In addition, a cluster may be considered to consist a number of physical nodes, each with a single OSI 102, a single instance of PNSD 116, and one set of RM daemon instances 114.

Figure 9:
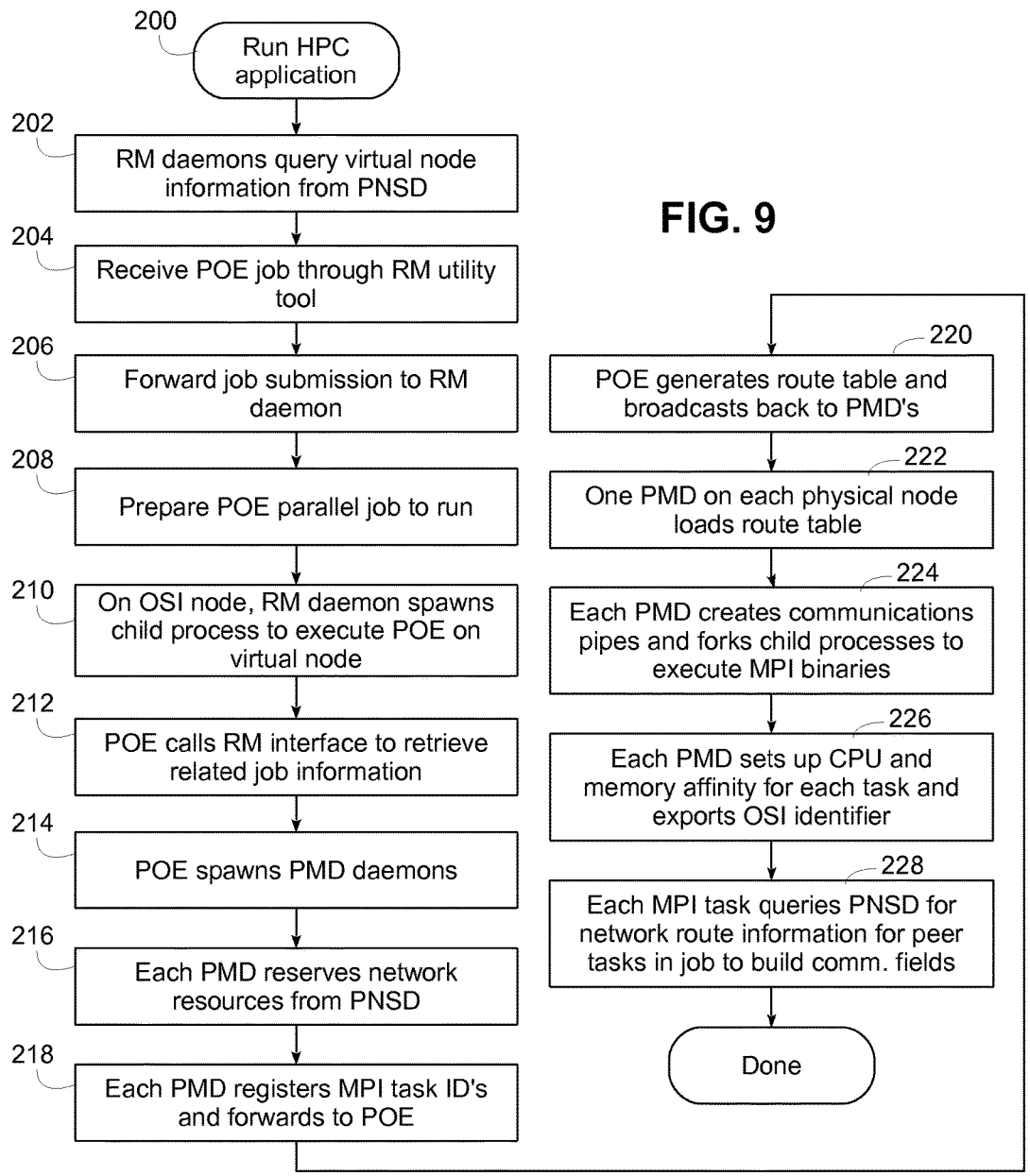
FIG. 9 is a flowchart illustrating an example sequence of operations for running an HPC application in the simulated HPC application environment of FIG. 3.

FIG. 9 next illustrates a routine 200 for running an HPC application in the simulated HPC application environment of FIGS. 3 and 6-8. First, during startup, RM daemons query virtual node information from PNSD (block 202). Then, in blocks 204 and 206, a user submits a POE job through the RM utility tool, and the job submission is received and forwarded to a specific RM daemon, where the job waits in a queue until the required resources are available for the job to use. Once the resources are ready and the internal resource allocation is done under the specific scheduling policy, the POE parallel job gets ready to run (block 208).

Next, in block 210, on a selected OSI/physical node, the RM daemon spawns a child process to execute the POE binary on a virtual node, binding to the allocated CPU and memory. Next, in block 212, POE calls the RM interface to retrieve the related job information from the RM daemon. This information may include, for example, the unique job key, number of tasks, number of nodes, and network windows required, among other items.

Next, in block 214, POE learns which nodes the RM has allocated to run the job's tasks. In the illustrated embodiment, POE makes no distinction between a physical node and a virtual node, since the RM is providing a virtual IP address. As such, POE calls the SCI API to spawn the PMD daemons in parallel: POE notifies SCI of which virtual nodes to use, and SCI internally constructs a tree-based topology and connects to the RM daemon on the designated virtual node IP address. The RM daemon listens for the connect request and forks a child process to execute the PMD daemon. In addition, for a multiple tier tree topology, PMD may use SCI to spawn the next layer of PMDs via the RM daemon. Eventually, POE can communicate with all the PMDs by calling the SCI API for gather, broadcast and p2p message passing. As a result, POE is able to logically communicate with any PMD.

Next, in block 216, after PMD is spawned by the RM daemon, PMD receives information about the job tasks and required network resources. PMD may use this information to reserve the network resources via an NRT API call to PNSD.

Next, in block 218, each PMD (on each virtual node) may register its MPI task ID's, using the unique job key, into PNSD by calling the Network Resource Table (NRT) API, and may then send its task ID's and the reserved network windows information to the POE. This allows POE to build a complete route table, which is broadcast back to all the PMD's (block 220).

Next, in block 222, each PMD (on each virtual node) may query all the task ID's per OSI node from PNSD for this job, and determine which PMD will permitted to load the route table. To avoid duplicate tables, only one PMD is generally permitted to load. PNSD may determine this by storing the process ID of the first PMD that attempts to load the NRT. Subsequent NRT load attempts from other PMD PID's may then be ignored. A subsequent NRT load attempt from the same PID may result in an error.

After route table loading is complete, each PMD (on each virtual node) may create related communications pipes and fork child processes to execute the MPI binaries (block 224). In addition, PMD may query the RM daemons for CPU ID and memory affinity information to allow PMD to setup the CPU and memory affinity for each task (block 226). PMD may also export an internal environment variable that allows the PE protocol stack to identify tasks running on the same OSI (even if in different virtual nodes). This may enable PE to direct those tasks to use shared memory to pass messages when appropriate, enhancing performance.

Then, in block 228, once each MPI task is spawned, it may invoke the NRT API to query PNSD for the network route information for its peer tasks in the job. The task may then build its point-to-point or collective communication fields with the corresponding algorithm as required. The HPC application may then begin to execute in the simulated HPC application environment Therefore, it can be seen that embodiments consistent with the invention enable a large scale HPC application environment, including a large number of MPI ranks distributed within a plurality of virtual nodes, to be simulated using a small number of physical nodes, including, in some embodiments, as few as one physical node.

Various modifications may be to the illustrated embodiments consistent with the invention. Therefore, the invention lies in the claims hereinafter appended.

What is claimed is:

1. An apparatus, comprising:
at least one physical computing node including one or more processors and one or more memories;
and program code configured upon execution by the at least one physical computing node to simulate a high performance computing (HPC) application environment by creating a cluster of virtual nodes on the at least one physical computing node, wherein the at least one physical computing node upon which the cluster of virtual nodes is created is a smaller number of physical computing nodes than a plurality of physical computing nodes of the HPC application environment to be simulated,
wherein creating the cluster of virtual nodes includes creating a plurality of virtual nodes in the cluster of virtual nodes within an operating system instance executing on the at least one physical computing node upon which the cluster of virtual nodes are created;

wherein the HPC application includes a plurality of parallel tasks distributed among at least a subset of the virtual nodes in the cluster, wherein the program code is further configured to create at least one resource manager component in the operating system instance and external from the plurality of virtual nodes and create at least one parallel job manager component within each of the plurality of virtual nodes, and wherein the program code is configured to execute the HPC application by creating the plurality of parallel tasks using the parallel job manager components within the plurality of virtual nodes, allocating and managing resources for the plurality of virtual nodes using the at least one resource manager component, and executing the plurality of parallel tasks in the at least a subset of the virtual nodes in the cluster.

2. The apparatus of claim 1, wherein the HPC application environment includes a runtime environment, and wherein the program code is configured to create the cluster of virtual nodes by creating within each of the plurality of virtual nodes only a subset of a runtime environment software stack for the runtime environment, wherein the subset of the runtime environment software stack includes the at least one parallel job manager component and excludes the at least one resource manager.

3. The apparatus of claim 2, wherein the runtime environment comprises a parallel environment runtime edition (PE RTE)-compatible runtime environment.

4. The apparatus of claim 2, wherein the program code is configured to create the at least one parallel job manager component within each of the plurality of virtual nodes by, for a master virtual node among the plurality of virtual nodes, creating a master parallel job manager component within the master virtual node.

5. The apparatus of claim 4, wherein the master parallel job manager component comprises a parallel operating environment (POE) application.

6. The apparatus of claim 2, wherein the program code is configured to create the at least one parallel job manager component within each of the plurality of virtual nodes by, for a second virtual node among the plurality of virtual nodes, creating a local parallel job manager component within the second virtual node.

7. The apparatus of claim 6, wherein the local parallel job manager component comprises a parallel management daemon (PMD) and wherein each of the plurality of parallel tasks comprises a message passing interface (MPI) rank.

8. The apparatus of claim 2, wherein the program code is configured to create the at least one parallel job manager component within each of the plurality of virtual nodes by creating a hierarchical tree of parallel job manager components including a parallel operating environment (POE) application and a plurality of parallel management daemons (PMD's), the POE application and each PMD resident in a different virtual node, each virtual node including a PMD further including at least one parallel task.

9. The apparatus of claim 1, wherein the at least one resource manager includes a first resource manager configured to manage a processor resource, a memory resource, a network resource or a combination thereof for the plurality of virtual nodes, and a second, local resource manager configured to maintain a network routing table for use in communicating between parallel tasks resident in the plurality of virtual nodes.

10. The apparatus of claim 9, wherein the first resource manager comprises a resource manager daemon and the second resource manager comprises a protocol network services daemon (PNSD), and wherein the PNSD, includes network resource virtualization manager functionality.

11. The apparatus of claim 1, wherein the program code is configured to execute the HPC application on the cluster of virtual nodes by:

in response to receiving a parallel job submission, forwarding the job submission to a resource manager daemon resident in the operating system instance;

with the resource manager daemon, spawning a child process to execute a parallel operating environment (POE) application on a first virtual node among the plurality of virtual nodes;

with the POE application, retrieving job information from the resource manager daemon and spawning a plurality of parallel management daemons (PMD's) in virtual nodes among the plurality of virtual nodes;

with each PMD, reserving a network resource from a protocol network services daemon (PNSD) resident in the operating system instance;

with each PMD, registering at least one parallel task ID with the PNSD and forwarding the at least one parallel task ID to the POE application;

with the POE application, building a route table using the parallel task ID forwarded by each PMD and broadcasting the route table to the PMD's; and with a PMD among the plurality of PMD's, loading the route table.

12. The apparatus of claim 11, wherein the program code is configured to spawn the plurality of parallel management daemons by:

notifying a scalable coherent interface (SCI) component of virtual nodes to be used by the HPC application; and in the SCI component, constructing a tree-based topology for the POE application and the plurality of PMD's and connecting to the resource manager daemon to cause the resource manager daemon to fork a child process to execute each PMD.

13. The apparatus of claim 12, wherein the program code is configured to spawn the plurality of parallel management daemons by, in a first PMD among the plurality of PMD's, using the SCI component to spawn another PMD.

14. The apparatus of claim 11, wherein with the PMD among the plurality of PMD's, loading the route table comprises, in the PNSD, allowing only one PMD on the physical computing node to load the route table.

15. The apparatus of claim 11, wherein the program code is configured to execute the HPC application on the cluster of virtual nodes further by:

with each PMD, creating at least one communication pipe and forking at least one child process to execute a parallel task;

with each PMD, querying the resource manager daemon for processor and memory affinity information;

with each PMD, setting up processor and memory affinity for each parallel task in response to querying the resource manager daemon; and with each parallel task, querying the PNSD for network route information for peer parallel tasks and building communication fields using the network route information.

16. The apparatus of claim 15, wherein the program code is configured to execute the HPC application on the cluster of virtual nodes further by, with each PMD, exporting an internal environment variable identifying parallel tasks running on the same operating system instance to enable the runtime environment to pass messages between the identified parallel tasks using shared memory.

17. The apparatus of claim 1, wherein the HPC application environment includes a runtime environment, wherein the runtime environment includes a runtime environment software stack, wherein the program code is configured to create the cluster of virtual nodes by creating within each of the plurality of virtual nodes only a subset of the runtime environment software stack, and wherein the program code is further configured to create an additional subset of the runtime environment software stack within the operating system instance and external to the plurality of virtual nodes.

18. A program product, comprising:
   a non-transitory computer readable medium; and
   program code stored on the non-transitory computer readable medium and configured upon execution by at least one physical computing node that includes one or more processors and one or more memories to simulate a high performance computing (HPC) application environment by creating a cluster of virtual nodes on the at least one physical computing node, wherein the at least one physical computing node upon which the cluster of virtual nodes is created is a smaller number of physical computing nodes than a plurality of physical computing nodes of the HPC application environment to be simulated,
   wherein creating the cluster of virtual nodes includes creating,
   a plurality of virtual nodes in the cluster of virtual nodes within an operating system instance executing on the at least one physical computing node; upon which the cluster of virtual nodes are created;
      wherein the HPC application includes a plurality of parallel tasks distributed among at least a subset of the virtual nodes in the cluster,
      wherein the program code is further configured to create at least one resource manager component in the operating system instance and external from the plurality of virtual nodes and create at least one parallel job manager component within each of the plurality of virtual nodes, and wherein the program code is configured to execute the HPC application by creating the plurality of parallel tasks using the parallel job manager components within the plurality of virtual nodes,
   allocating and managing resources for the plurality of virtual nodes using the at least one resource manager component, and executing the plurality of parallel tasks in the at least a subset of the virtual nodes In the cluster.

* * * * *